(12) United States Patent
Yu

(10) Patent No.: US 6,238,240 B1
(45) Date of Patent: May 29, 2001

(54) PC CARD CONNECTOR ASSEMBLY

(75) Inventor: Hung-Chi Yu, Hsi-Chih (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/378,613

(22) Filed: Aug. 20, 1999

(30) Foreign Application Priority Data

Dec. 18, 1998 (TW) .................................................. 87221146

(51) Int. Cl.[7] ............................ H01R 13/60; H01R 13/66
(52) U.S. Cl. .................................... 439/541.5; 439/607
(58) Field of Search .................................. 439/541.5, 79, 439/108, 607, 60

(56) References Cited

U.S. PATENT DOCUMENTS

| 5,636,999 | * | 6/1997 | Hirai et al. | 439/79 |
| 5,688,130 | * | 11/1997 | Huang | 439/79 |
| 5,775,923 | * | 7/1998 | Tomioka | 439/79 |
| 5,795,190 | * | 8/1998 | Ono | 439/607 |
| 5,967,803 | * | 10/1999 | Ho | 439/79 |

* cited by examiner

*Primary Examiner*—Tulsidas Patel
*Assistant Examiner*—Brian S. Webb
(74) *Attorney, Agent, or Firm*—Wei Te Chung

(57) ABSTRACT

A PC card connector assembly comprises stacked upper and lower header connectors and an elongate spacer. Each header connector includes a row of upper terminals and a row of lower terminals. The upper terminals and the lower terminals have mounting portions which are staggered and arranged to lie in the same plane. A grounding plate mounted to a top surface of the lower header connector has a row of grounding fingers downwardly extending therefrom. The spacer defines three rows of passageways for accommodating the mounting portions of the terminals and the grounding fingers. The spacer is inserted into a connector mounted on a mother board.

8 Claims, 7 Drawing Sheets

PC CARD CONNECTOR ASSEMBLY

BACKGROUND OF THE INVENTION

The present invention generally relates to a PC (Personal Computer) card connector assembly, and particularly to a stacked PC card connector assembly having a spacer for facilitating connection between the assembly and a connector mounted on a circuit board.

A PC card connector is commonly for use in a note book computer for providing electrical connection between a PC card and a mother board. An electrical device on the mother board reads data from or writes information to the PC card. Computer manufacturers tend to install stacked PC card connectors such as those disclosed in Taiwan Patent Application Nos. 83218076 and 84112508.

Referring to FIGS. 1 and 2, a conventional PC card connector assembly 1 comprises a pair of stacked housings 11 each retaining two rows of signal terminals 10. Two card edge connectors 40 are mounted on a circuit board 4. Two daughter boards 3 are received in the card edge connectors 40. Distal ends of the terminals 10 extending beyond the housings 11 are inserted into the daughter boards 3 and soldered to corresponding connection thereon. However, the terminals 10 in the housings 11, are arranged with a high pitch such that the corresponding solder sites thereof on the daughter boards 3 are also arranged with a high pitch thereby complicating the soldering process thereof. After the terminals 10 are soldered to the daughter boards 3, the daughter boards 3 are then inserted into the corresponding card edge connectors 40. During such a process, the daughter boards 3 are likely to deflect thereby damaging the solder sites and adversely affecting the quality of signal transmission therethrough. The daughter boards 3 of a certain height are perpendicular to the circuit board 4 thereby hindering miniaturization of the note book computer.

SUMMARY OF THE INVENTION

Accordingly, a first purpose of the present invention is to provide a PC card connector assembly having a spacer which facilitates electrical connection between the assembly and the mother board.

A second purpose of the present invention is to provide a compact PC card connector.

To fulfill the above-mentioned purposes, a PC card connector assembly in accordance with the present invention comprises stacked upper and lower header connectors and an elongate spacer. Each header connector includes a row of upper terminals and a row of lower terminals. The upper terminals and the lower terminals have mounting portions which are staggered and arranged to lie in the same plane. A first grounding plate is mounted to a top surface of the upper header connector. A second grounding plate mounted to a top surface of the lower header connector has a row of grounding fingers downwardly extending therefrom. The first grounding plate downwardly extends and electrically contacts the second grounding plate. The spacer defines three rows of passageways for accommodating the mounting portions of the terminals and the grounding fingers. A connector mounted on a mother board includes two rows of mating contacts and a metal plate. The spacer is inserted into the connector and the terminals and the grounding fingers engage with the contacts and the metal plate, respectively.

DETAILED DESCRIPTION OF THE PREFERRED EMBODIMENTS

Figure 1:
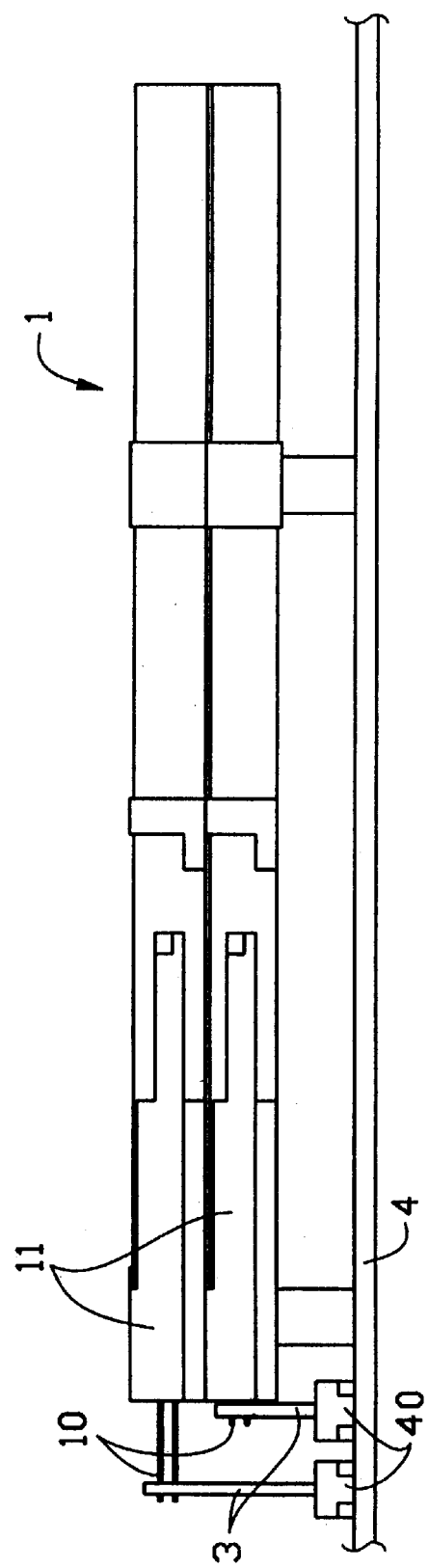
FIG. 1 is a side planar view of a conventional PC card connector mounted to a mother board via a pair of daughter boards received in a pair of card edge connectors.
Figure 2:
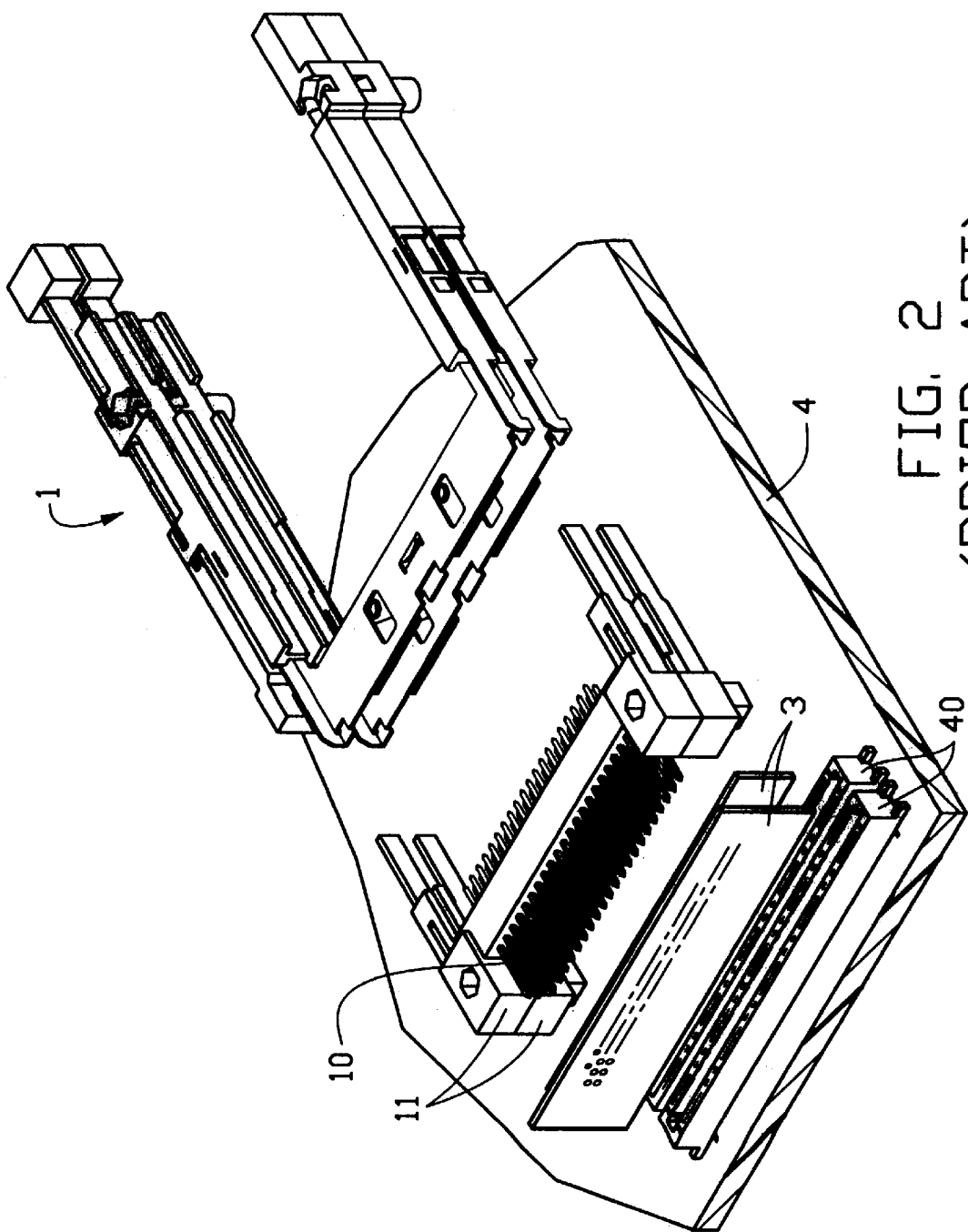
FIG. 2 is an exploded view of the PC card connector, the daughter boards, the card edge connectors and the mother board of FIG. 1.
Figure 3:
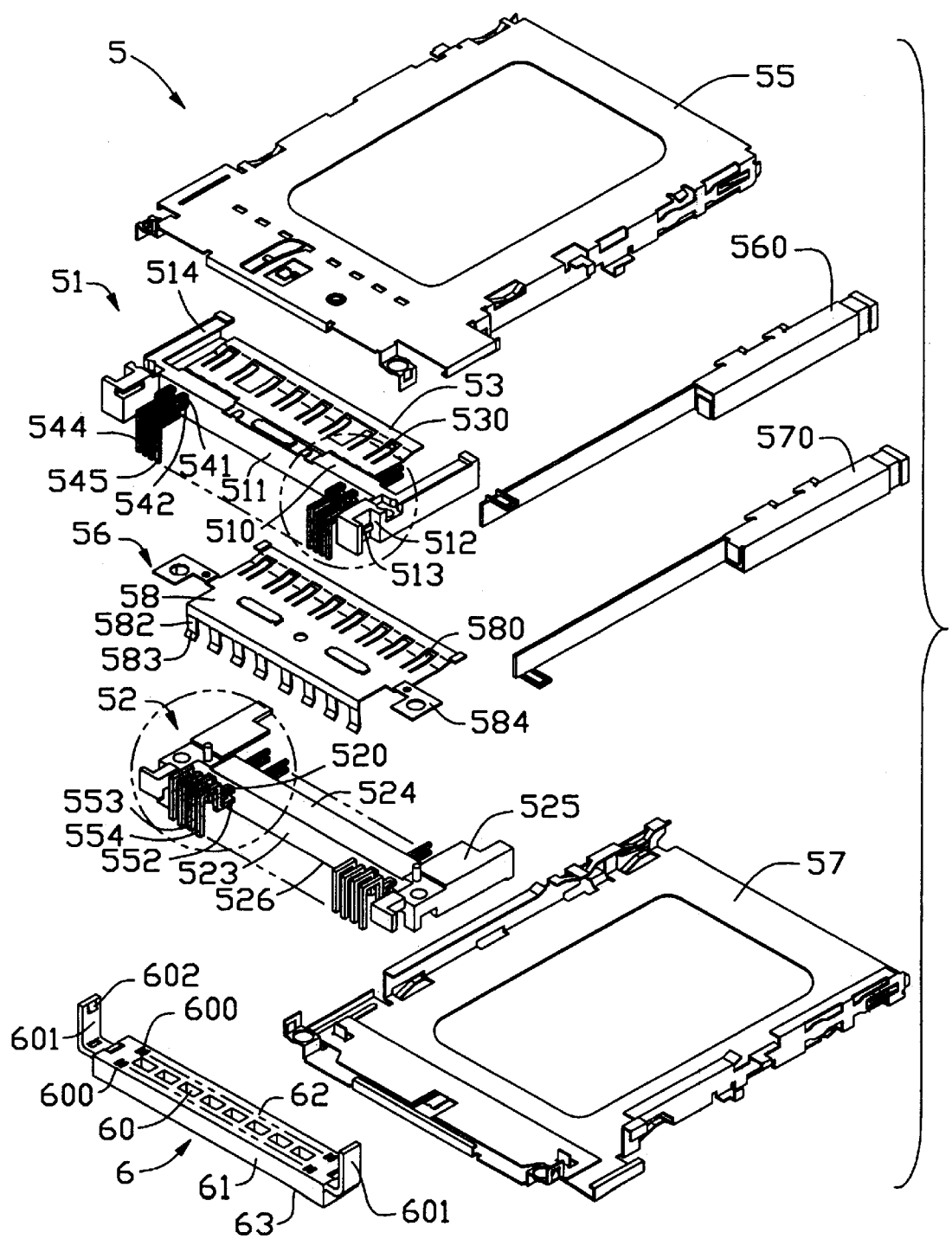
FIG. 3 is an exploded view of a PC card connector assembly in accordance with the present invention.
Figure 3A:
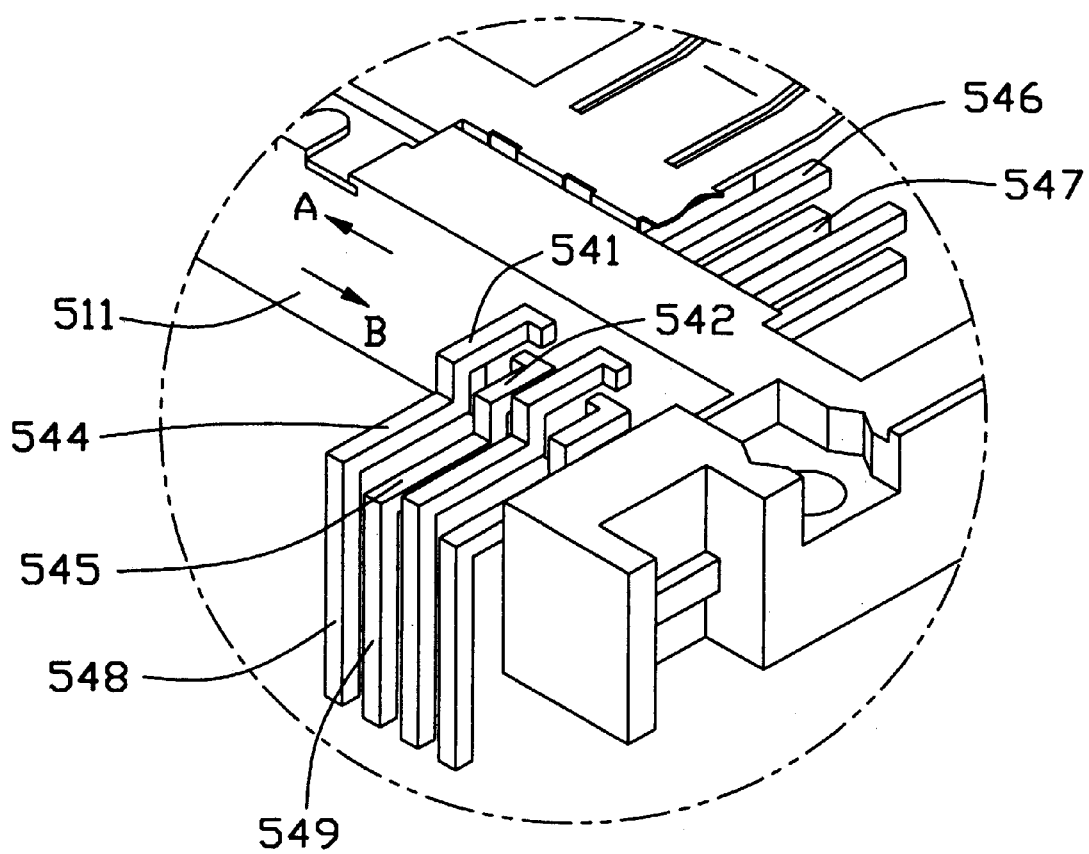
FIG. 3A is an enlarged view of part of an upper header connector of the PC card connector assembly of FIG. 3.
Figure 4:
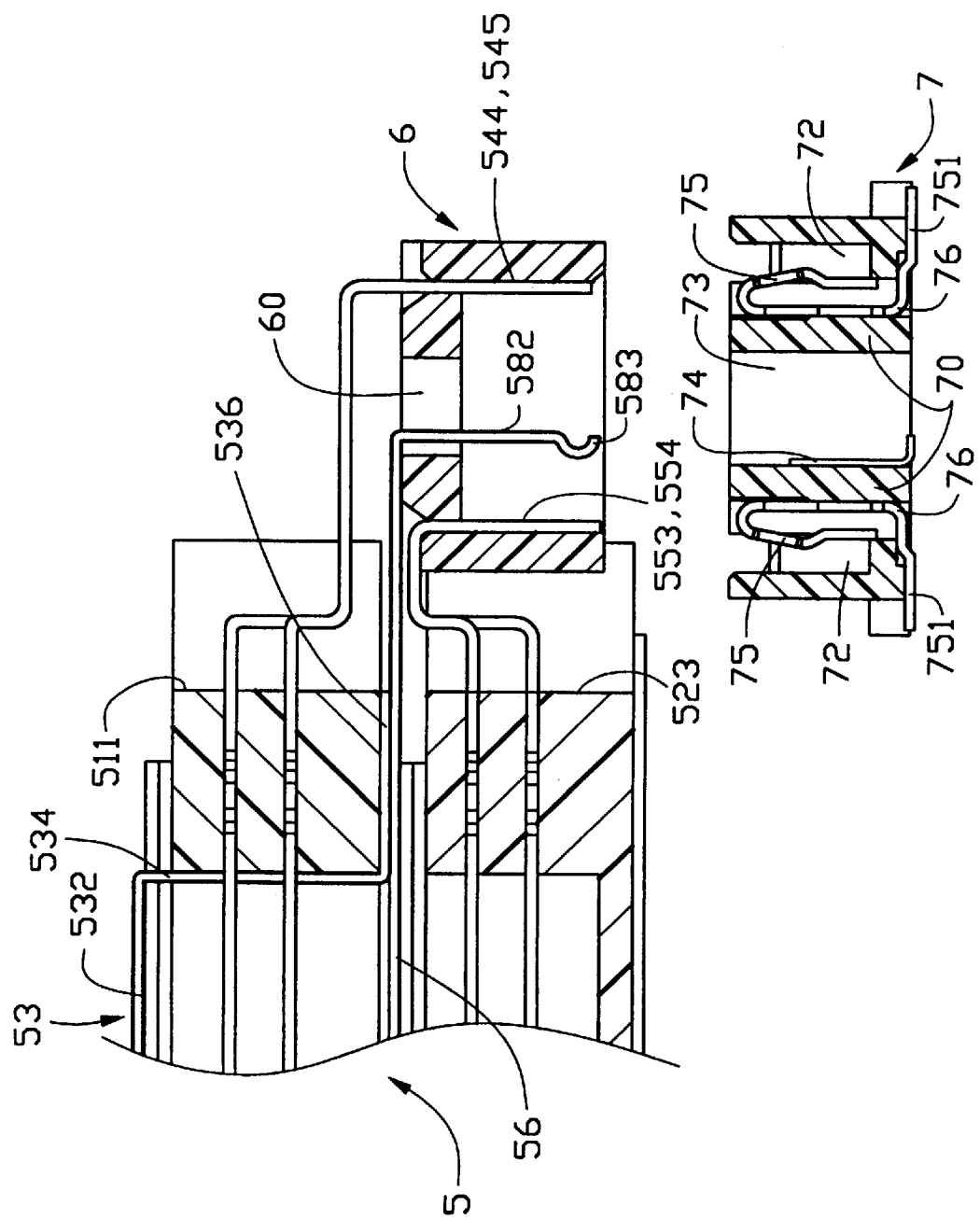
FIG. 4 is a partial cross-sectional view of the PC card connector assembly and a connector in accordance with the present invention.

Referring to FIGS. 3 and 4, a PC card connector assembly 5 in accordance with the present invention comprises stacked upper and lower header connectors 51, 52 and an elongate spacer 6. The upper header connector 51 includes an upper housing 510 and a row of upper terminals 541 and a row of lower terminals 542 retained in the upper housing 510. The upper housing 510 has a mounting surface 511. The terminals 541, 542 in each row are arranged with a pitch of 1.27 mm. The upper and lower terminals 541, 542 extend beyond the mounting surface 511 of the upper housing 510 and are transversely staggered to form stepped mounting portions 544, 545 (FIG. 3A). The upper and lower terminals 541, 542 extend through the upper housing 510 in a direction opposite to that of the mounting portions 544, 545 to form mating portions 546, 547 arranged in upper and lower levels for connecting with a memory card (not shown) inserted into the connector assembly 5. Such a staggered structure is manufactured by stamping the mounting portions 544, 545 to have a width substantially less than the width of the parts of the terminals 541, 542 retained in the upper housing 510. The mounting portions 544, 545 downwardly extend and are respectively form tail portions 548, 549 which arranged to lie in a same row. The tail portions 548, 549 of adjacent mounting portions 544, 545 are arranged with a pitch of 0.635 mm, which is half the pitch of the mating portions 546, 547. The upper housing 510 defines a pair of mounting recesses 512 in opposite lateral edges thereof proximate a front edge thereof with a latch 513 formed in each mounting recess 512.

Figure 3B:
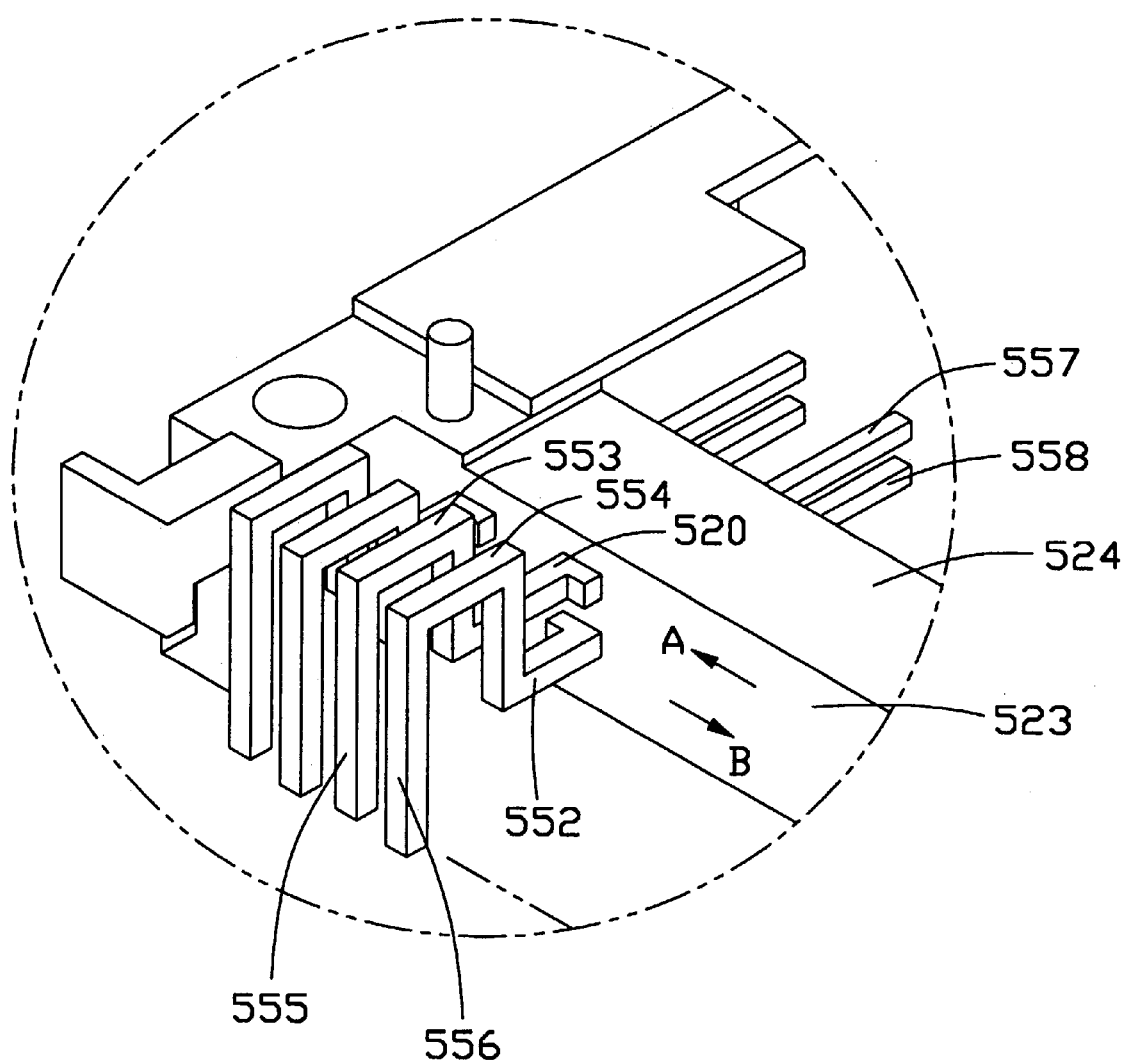
FIG. 3B is an enlarged view of part of a lower header connector of the PC card connector assembly of FIG. 3.

The lower header connector 52 includes a lower housing 524 and a row of upper terminals 520 and a row of lower terminals 552. The lower housing 524 has a mounting surface 523. The upper and lower terminals 520, 552 extend beyond the mounting surface 523 and are transversely staggered to form U-shaped mounting sections 553, 554 (FIG. 3B). Such a staggered structure is manufactured by stamping the mounting sections 553, 554 to have a width substantially less than the width of the parts of the terminals 520, 552 retained in the lower housing 524. The mounting sections 553, 554 downwardly extend to form tail portions 555, 556 which are arranged in a same row.

As is best shown in FIG. 3A, the mounting portions 544, 545 of the upper and lower terminals 541, 542 are offset a distance from their respective mating portions 546, 547 in respectively opposite directions, said directions being designated by arrows "A" & "B". Further referring to FIG. 3B, the mounting sections 553, 554 of the upper and lower terminals 520, 552 are respectively offset a distance from their respective mating portions 557, 558 in respectively opposite directions, said directions being designated by arrows "A" & "B".

The PC card connector assembly 5 further comprises a first shield 55 mounted to a top surface 514 of the upper header connector 51 and a second shield 57 mounted to a bottom surface 526 of the lower header connector 52 for shielding the terminals 541, 542, 520, 552 from external interference. A first ejection mechanism 560 and a second ejection mechanism 570 are mounted to the first shield 56 and the second shield 57 for ejecting a PC card from the upper header connector 51 and the lower header connector 52, respectively.

A first grounding plate 56 mounted to a top surface 525 of the lower header connector 52 includes a planar portion 58 and a pair of mounting ears 584 outwardly extending from the planar portion 58 for mounting the first grounding plate 56 to the lower header connector 52. A row of spring strips 580 is stamped in the planar portion 58. A plurality of grounding fingers 582 downwardly extends from a front edge of the planar portion 58. Each grounding finger 582 forms an arcuate contact portion 583. A second grounding plate 53 mounted to the top surface 514 of the upper header connector 51 includes a plurality of spring strips 530. Referring particularly to FIG. 4, the second grounding plate 53 includes a first horizontal portion 532 mounted on the top surface 514 of the upper header connector 51, a vertical portion 534 downwardly extending from the first horizontal portion 532 and a second horizontal portion 536 forwardly extending from the vertical portion 534. The second horizontal portion 536 electrically contacts the first grounding plate 56.

The spacer 6 includes a base 61 and a pair of mounting arms 601 upwardly extending from opposite ends of the base 61. One row of first passageways 60 and two rows of second passageways 600 are defined between a top surface 62 and a bottom surface 63 of the base 61. The first passageways 60 are arranged between the two rows of second passageways 600. The first passageways 60 are larger than the second passageways 600. Each mounting arm 601 has a projection 602 adapted to engage with the latch 513 of the upper header connector 51 thereby securing the spacer 6 to the upper header connector 51. The stepped mounting portions/sections 544, 545, 553, 554 of the terminals 541, 542, 520, 552 of the upper and lower header connectors 51, 52 are received in the second passageways 600 of the spacer 6. The grounding fingers 582 of the first grounding plate 56 are received in the first passageways 60.

A connector 7 mounted on a mother board (not shown) includes an insulative housing 70 defining two rows of cavities 72 and a groove 73 arranged between the two rows of cavities 72. A contact 76 disposed in each cavity 72 includes a reversely bent contact section 75 and a solder section 751 soldered to the mother board using Surface Mounting Technology. An elongate metal plate 74 is attached to an inner surface of the groove 73 and soldered to the mother board using Surface Mounting Technology.

In assembly, the spacer 6 is inserted into the connector 7. The mounting portions/sections 544, 545, 553, 554 of the header connectors 51, 52 and the grounding fingers 582 of the first grounding plate 56 engage with the contacts 76 and the metal plate 74 of the connector 7, respectively.

Such a connection between the spacer 6 and the connector 7 has a limited height and is apparently reliable thereby ensuring quality signal transmission therethrough. In addition, the mounting portions 544, 545 of the terminals 546, 542 and the mounting sections 553, 554 of the terminals 520, 552 can have different shapes and still be received in the connector 7.

Figure 5:
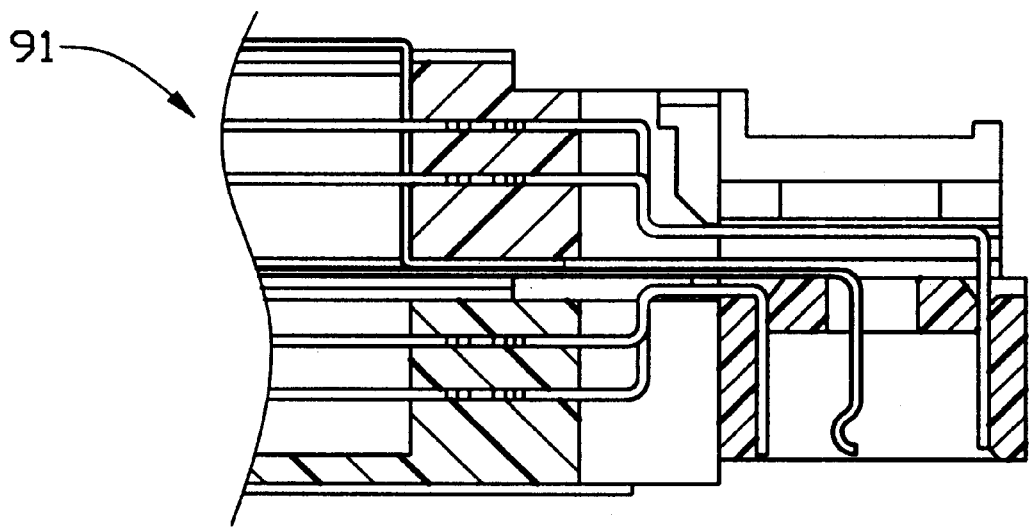
FIG. 5 is a partial cross-sectional view of the PC card connector assembly adapted to be mounted to an upper surface of a mother board.
Figure 6:
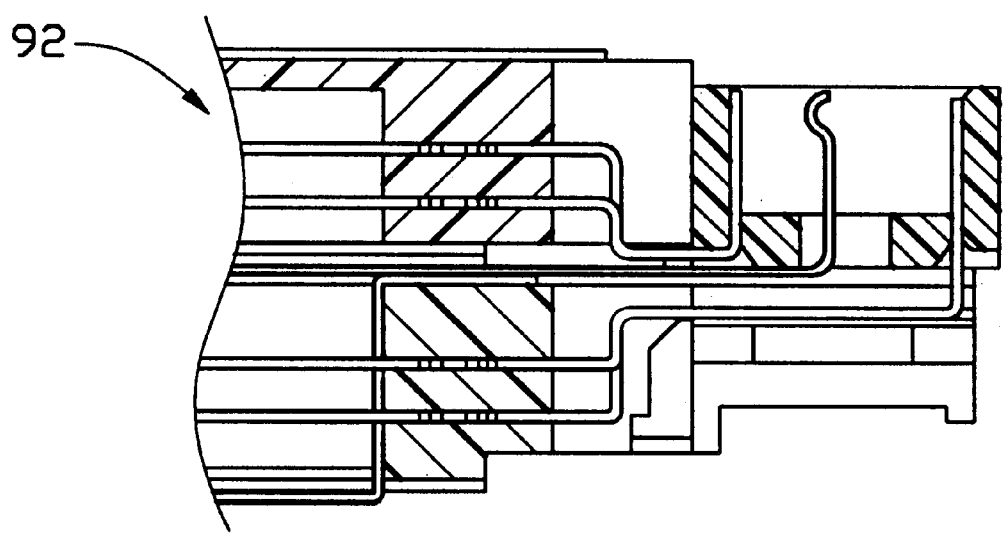
FIG. 6 is a partial cross-sectional view of the PC card connector assembly adapted to be mounted to a lower surface of a mother board.

FIG. 5 shows a PC card connector assembly 91 of a second embodiment of the present invention. The PC card connector assembly 91 is to be mounted to a top surface of the mother board. FIG. 6 shows a PC card connector assembly 92 of a third embodiment of the present invention. The PC card connector assembly 92 is to be mounted to a lower surface of the mother board.

While the present invention has been described with reference to specific embodiments, the description is illustrative of the invention and is not to be construed as limiting the invention. Various modifications to the present invention can be made to the preferred embodiment by those skilled in the art without departing from the true spirit and scope of the invention as defined by the appended claims.

I claim:

1. An electrical card connector assembly for providing connection between a pair of electrical cards and a mother board, comprising:

an upper and a lower stacked shielded header connectors, each header connector including an insulative housing defining a space for receiving a corresponding electrical card;

a row of upper terminals and a row of lower terminals retained in the housing of each of upper and lower header connectors for engaging with a corresponding electrical card, each terminal being retained in a corresponding housing and having a mounting portion and a mating portion at opposite ends thereof, the mounting portion having a narrower cross-section than the part retained in the housing, the mounting portion of each upper terminal being disposed to be offset a distance relative to the mating portion of the same upper terminal toward one lengthwise side of the housing that the upper terminal is retained in, and the mounting portion of each lower terminal being disposed to be offset a distance relative to the mating portion of the same lower terminal toward an opposite lengthwise side of the the housing that the lower terminal is retained in, whereby tail portions of the upper and lower terminals in each housing are aligned in a same row and have a pitch between each other equal to half a distance of the pitch between the mating portions of the same terminals;

a first grounding plate mounted to a top surface of the lower header connector and having a plurality of grounding fingers;

a second grounding plate mounted to a top surface of the upper header connector and downwardly extending to electrically contact the first grounding plate;

a spacer defining a plurality of rows of passageways accommodating the mounting portions of the upper and lower terminals and a row of passageways to accomodate the grounding fingers of the first grounding plate between the rows of passageways accommodating the mounting portions of the upper and lower terminals; and a receptacle connector mounted on a mother board and connected with the spacer, the receptacle connector including a plurality of mating contacts engaged with the terminals of the header connectors and a metal plate in contact with the grounding fingers of the first grounding plate.

2. The electrical card connector assembly as claimed in claim 1, wherein the mounting portions of the upper and lower terminals of the upper header connector have a stepped structure.

3. The electrical card connector assembly as claimed in claim 1, wherein the mounting portions of the upper and lower terminals of the lower header connector are U-shaped.

4. The electrical card connector assembly as claimed in claim 1, wherein the upper header connector has an insulative housing defining a pair of recesses with a latch formed in each recess, and wherein the spacer includes a base and a pair of mounting arms formed on opposite ends of the base, each mounting arm forming a projection for engaging with the latch of the upper header connector thereby securing the spacer to the upper header connector.

5. The electrical card connector assembly as claimed in claim 1, wherein each grounding finger of the first grounding plate has an arcuate contact portion.

6. The electrical card connector assembly as claimed in claim 1, wherein the receptacle connector defines two rows of cavities and a groove between the two rows of cavities for respectively receiving the mating contacts and the metal plate therein.

7. The electrical card connector assembly as claimed in claim 6, wherein each mating contact of the receptacle connector has a reversely bent contact section.

8. An electrical card connector assembly for providing connection between an electrical card and a mother board, comprising:
   an upper and a lower stacked shielded header connectors, each header connector including an insulative housing defining a space for receiving the electrical card,
   at least one row of upper terminals and at least one row of lower terminals retained in each header connector for engaging with the electrical card;
   a first grounding plate mounted to a top surface of the lower header connector and having a plurality of grounding fingers;
   a second grounding plate mounted to a top surface of the upper header connector and downwardly extending to mechanically and electrically contact the first grounding plate;
   a spacer defining a plurality of first passageways and a plurality of second passageways by two sides of the first passageways, said first passageways accommodating the mounting portions of the terminals, and said second passageways accommodating the grounding fingers of the first grounding plate; and
   a receptacle connector mounted on a mother board and connected with the spacer, the receptacle connector including a plurality of mating contacts engaged with the terminals of the header connectors and a metal plate positioned between the mating contacts in contact with the grounding fingers of the first grounding plate.

* * * * *